United States Patent [19]

Hudgins

[11] 4,343,584
[45] Aug. 10, 1982

[54] APPARATUS FOR SEQUENTIALLY TRANSPORTING CONTAINERS

[75] Inventor: Jerry L. Hudgins, Guntersville, Ala.

[73] Assignee: The United States of America as represented by the Administrator of the National Aeronautics and Space Administration, Washington, D.C.

[21] Appl. No.: 168,944

[22] Filed: Jul. 11, 1980

[51] Int. Cl.$^3$ .............................................. B65G 65/02
[52] U.S. Cl. .................................. 414/222; 414/226; 414/739; 294/116
[58] Field of Search ............... 414/222, 225, 226, 589, 414/684, 729, 738, 739; 294/88, 90, 116

[56] References Cited

U.S. PATENT DOCUMENTS

| | | | |
|---|---|---|---|
| 1,794,424 | 3/1931 | Smith | 414/226 X |
| 2,573,660 | 10/1951 | Brownell | 414/225 X |
| 3,314,554 | 4/1967 | Coniberti | 414/739 |
| 3,333,883 | 8/1967 | Kikuchi | 294/90 |
| 3,874,525 | 4/1975 | Hassan | 414/225 |
| 3,954,164 | 5/1976 | Bottomley | 414/739 X |
| 4,255,075 | 3/1981 | Babbitt | 414/222 |
| 4,311,031 | 1/1982 | Schwarze | 414/225 X |

FOREIGN PATENT DOCUMENTS 141613  6/1960  U.S.S.R. ............................ 414/739

Primary Examiner—John J. Love
Assistant Examiner—Terrance L. Siemens
Attorney, Agent, or Firm—Joseph H. Beumer; John R. Manning; L. D. Wofford, Jr.

[57] ABSTRACT

Apparatus for transferring and manipulating a plurality of containers in a sequence is disclosed including a mechanical manipulator arm 10 having a gripping device B which automatically picks up a container at a fixed pickup position P and transfers it to a processing station. At a processing station X, the container is loaded with silicon wafers and thereafter returned by the arm to the fixed position P at the pickup and return station Y. A plurality of the containers may be processed in sequence from the fixed pickup position by providing a movable carriage 58 upon which container pedestal platforms 54 and 56 are supported, at least one of which is an elevator platform. The platforms include abutments 54c and 56c for properly positioning the containers for accurate pickup by the manipulator arm. Sensing switches may be provided for sensing movements of the arm 10, carriage 58, and elevator platform 56 whereby the entire apparatus may be controlled automatically avoiding the need to handle the wafers manually to reduce the possibility of contamination.

13 Claims, 7 Drawing Figures

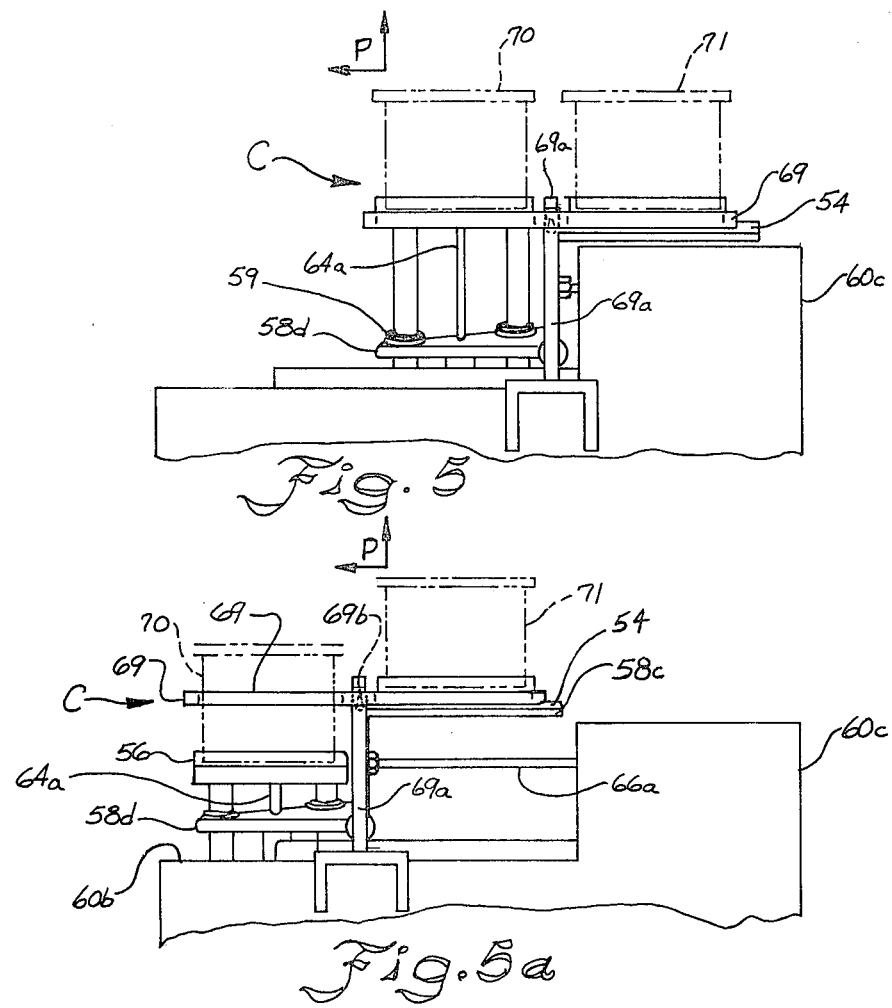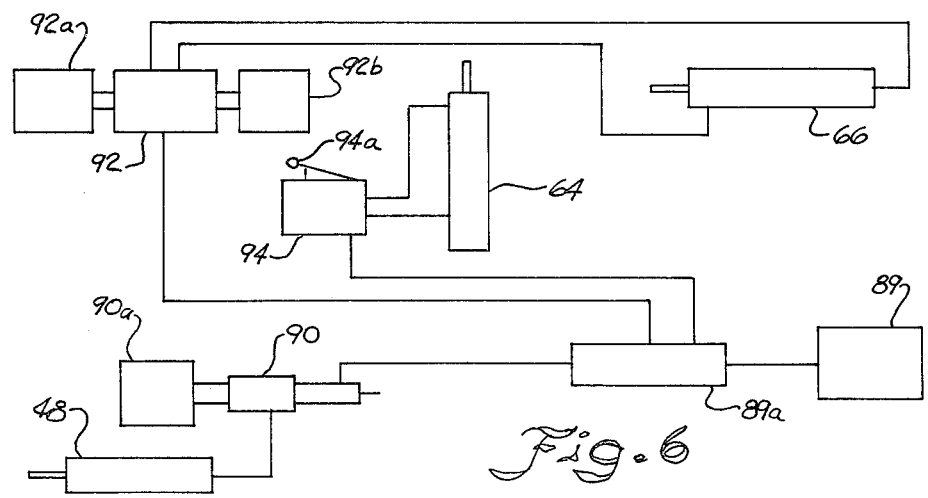

APPARATUS FOR SEQUENTIALLY TRANSPORTING CONTAINERS

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The invention relates to remote manipulation and transfer of articles and containers of the type employing a movable transfer arm having a gripping device carried adjacent the free end thereof which moves between processing stations. One prior system generally of the type described above is shown in U.S. Pat. No. 4,141,457 wherein a pivotable transfer arm transfers individual lithographic plates from a stack contained on an elevator platform to a delivery belt which discharges the lithographic plate to a plate processor. The pivotable transfer arm includes a vacuum gripping device.

The present invention has as its objective the provision of apparatus for manipulating and transferring a plurality of containers in a sequence between a loading station where the containers are loaded with silicon wafers and a pickup station where empty containers are picked up and the containers are returned loaded.

Another important object of the present invention is the provision of apparatus for manipulating and transporting containers of silicon wafers between a processing stations which may be automated to eliminate the need for a human attendant whereby the possibility of contamination of the wafers is reduced.

Yet another important object of the present invention is the provision of apparatus for manipulating and transferring a plurality of containers in a sequence between processing stations where the pickup station includes a movable carriage and pedestals carried thereon for processing a plurality of the containers in individual sequence at a fixed point.

Yet another important object of the present invention is the manipulation and transportation of containers of silicon wafers between processing stations where a fixed pickup position includes platform structure which assures the proper positioning of the containers thereon for reliable pickup by the manipulator arm.

Yet another important object of the present invention is the provision of apparatus for manipulating and transporting containers of silicon wafers which includes a mechanical manipulator arm having a gripping device which reliably grips the containers for pickup and contains the wafers therein for movement in a horizontal and vertical orientation.

SUMMARY OF THE INVENTION

It has been found that apparatus for manipulating and transferring containers of silicon wafers between processing stations can be had by providing a pickup assembly station having a two-position pedestal, a pivotable transfer arm having forward and rear operational positions, and a gripping device carried adjacent a remote end of the arm. At a forward, loading position the silicon wafers are loaded into a container which has been picked up at a rear fixed pickup position where the loaded container is subsequently returned. A pickup station includes a carriage which carries the two-position pedestal having a plurality of platforms where one of the platforms is an elevator. Upon the loading and return of an initial container the two-position pedestal shifts to place an empty container at the fixed pickup position and the elevator platform and loaded container are dropped below a remaining container. The gripping device of the transfer arm may thus have access to the remaining container for engagement and pickup during the sequential processing of the individual containers. Automation may be provided by microswitches which feed a computer controlling the movement of the transfer arm and the two-position pedestal by conventional computer programming. In a preferred form, the movement of the apparatus is provided by pneumatic actuation and computer controlled valving.

BRIEF DESCRIPTION OF THE DRAWINGS

The construction designed to carry out the invention will be hereinafter described, together with other features thereof.

The invention will be more readily understood from a reading of the following specification and by reference to the accompanying drawings forming a part thereof, wherein an example of the invention is shown and wherein:

FIG. 5 is a schematic view illustrating a first container located on an elevator platform at a fixed pickup position according to the invention;

FIG. 5a is a schematic view illustrating a second container on a second platform at the fixed pickup position of FIG. 5; and FIG. 6 is a schematic view of a pneumatic control system for automatically controlling apparatus constructed according to the invention sequentially.

DESCRIPTION OF A PREFERRED EMBODIMENT

Figure 1:
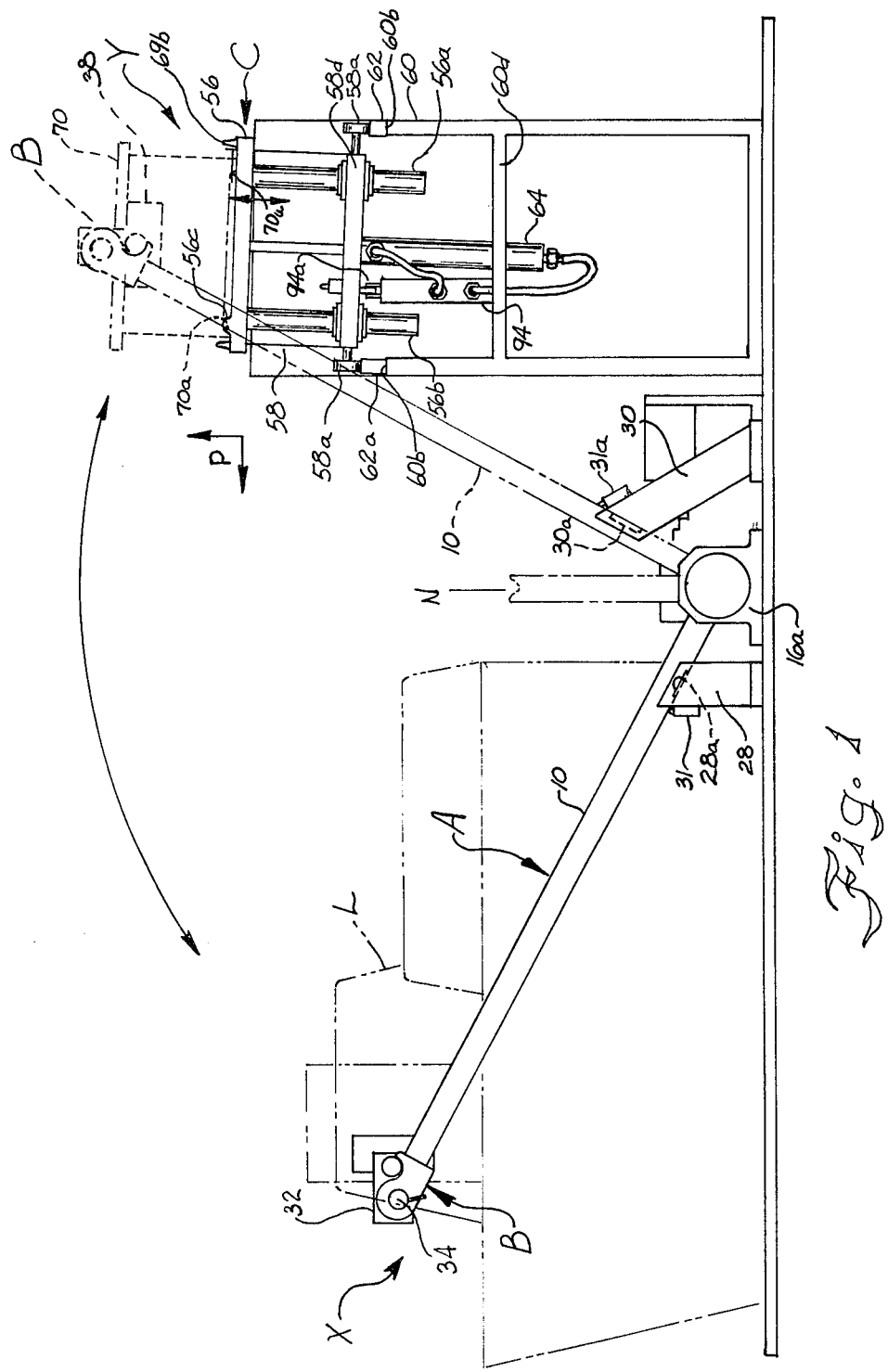
FIG. 1 is a side elevational view of apparatus for manipulating and transferring containers of silicon wafers according to the invention.
Figure 2:
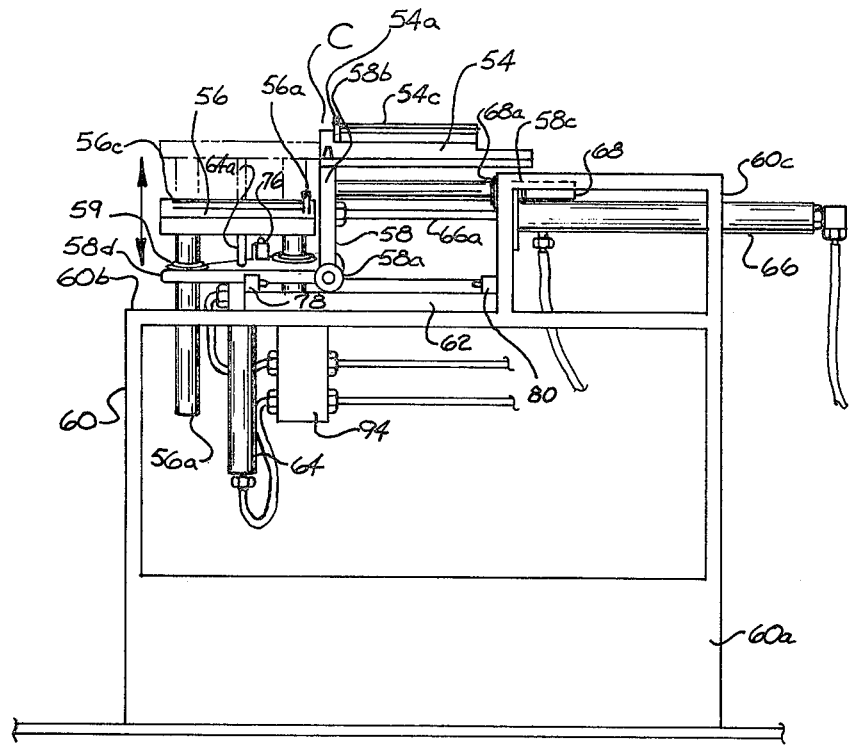
FIG. 2 is a side elevation of a pickup and return station assembly according to the invention.

The invention relates to apparatus for manipulating and sequentially transferring containers between a first station X at which a container is loaded with silicon wafers and a second station Y at which the container is initially picked up empty and returned loaded. The apparatus includes a movable transfer arm mechanism A movable between the first and second stations having a gripping device B carried adjacent an end thereof for picking up and holding the container and silicon wafers therein in a stable manner for transfer and manipulation.

The second, pickup and return station processes a plurality of the containers in sequence and includes a fixed pickup position P where the containers are picked up and returned. Pedestal means C is provided for supporting a plurality of containers for pickup and return individually at pickup position P. Means for properly positioning the containers at pickup position P is provided affording reliable pickup of the containers by the gripping device of the arm mechanism. Carriage means supports the pedestal means at the second station which is movable between first and second positions to shift the pedestal means and place the containers individually at pickup position P. The pedestal means includes an elevator platform for supporting an individual container and lowering the container below the level of a remaining container when the remaining container is shifted to the pickup position by the carriage means whereby the lowered container affords access for engagement of the container by the gripping device.

Referring now in more detail to the drawings the apparatus of the present invention is illustrated as including mechanical transfer arm mechanism A which includes transfer arm 10 and sleeve 12 which fixedly carries a shaft 12a. Suitable bearings 14a and 14b are fixed in bearing blocks 16a and 16b and receive the shaft 12a and provide means by which the sleeve 12 and shaft 10 pivot about the bearing blocks. A gear 18 is fixed to one end of the shaft 12a which meshes with a worm gear 20 coupled to an electric motor 22 by means of a gear reduction box 24 which reduces the rotational speed of the drive shaft of motor 22 and effects a smooth slow rotation of the transfer arm 10. The opposite end of shaft 12a carries a coil spring 26 which aids movement of arm 10 in initially lifting a loaded container at station X by having one end of the spring fixed in the bearing block 16a or plate 16b. Arm 10 has a neutral position N at which it's held by the worm gear arrangement.

The transfer arm mechanism further includes stop members 28 and 30 which define first and second limit positions for the movement of the arm. Each hard stop includes a microswitch 28a and 30a which connect with conventional controls for the motor 22 to terminate the pivotable drive of the arm 10 when it reaches either limit position. In operation, arm 10 will reach the limit position and will be positively positioned thereby for gripping of a container and the processing thereof. At the forward operational position the arm places the container vertically upon the loading platform at station X and at a rear operational position the arm picks up and places containers horizontally on the pedestal platforms at station Y. Switches 31 and 31a detect the presence of the arm in its forward and rear operational positions and produce signals for the purposes of computer input and automatic control.

Figure 3:
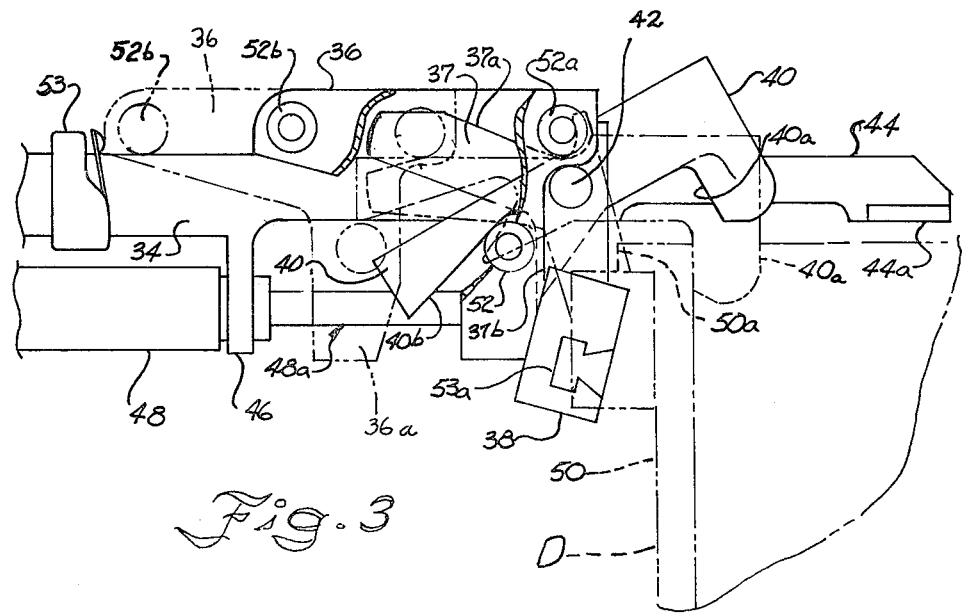
FIG. 3 is a side elevation of an enlarged partially cut-away view of a gripping device constructed according to the invention for picking up a container of silicon wafers.
Figure 4:
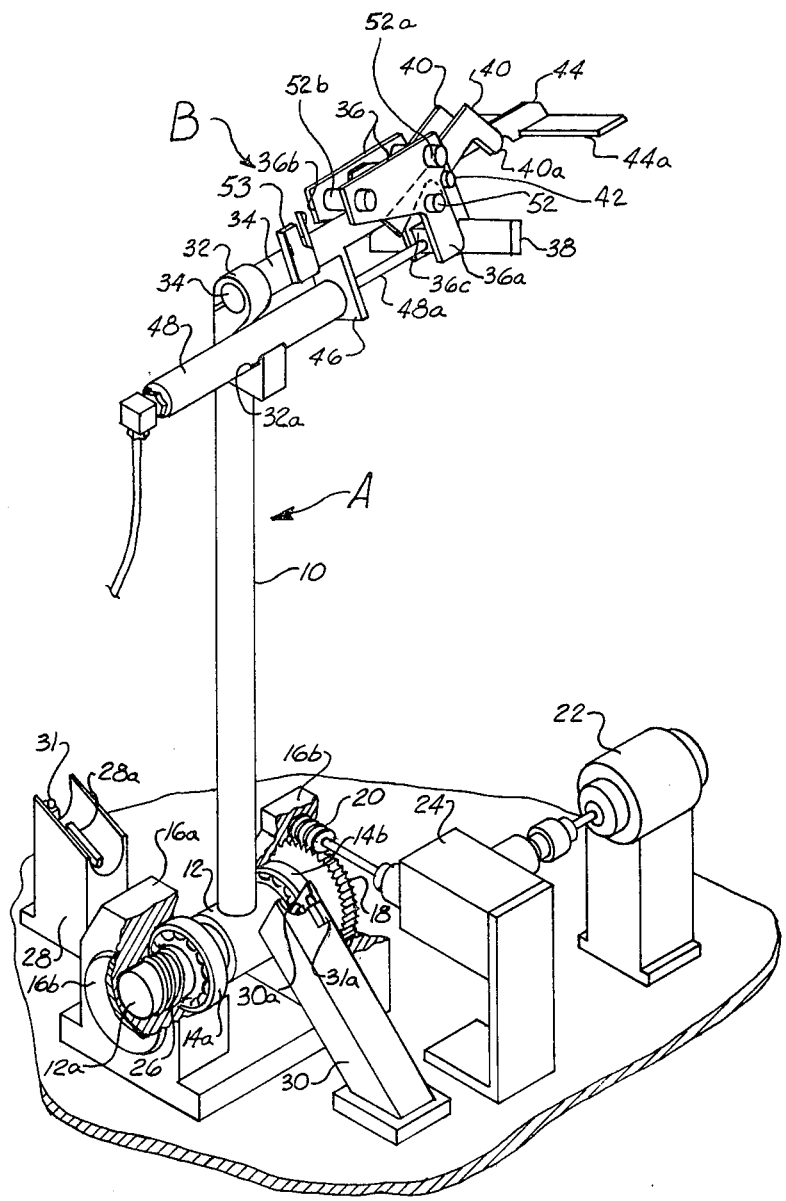
FIG. 4 is a perspective view illustrating transfer arm apparatus and gripping device of FIG. 3 carried adjacent one end thereof according to the invention for manipulating and transferring containers.

The gripping device B includes a connecting bearing 32 carried adjacent the end of arm 10 having a catch portion 32a. The connection bearing 32 fixedly receives a shaft 34 on which the linkage assembly of the gripping device is carried which includes a pair of spaced brackets 36 having L-shaped ends 36a. Inner lever arms 40 are pivotably carried by a pin 42 extending on either side of shaft 34. Intermediate bracket 37 is also pivotably carried about pin 42 and includes a pair of upper fork arms 37a which straddle shaft 34 and a single lower L-shaped arm block 37b. A bar 38 is carried across the lower arm 37b which pivots to engage the side of container D as arm block portion 40a of inner arms 40 pivot and grip over the top edge of the container side as shown in dotted lines in FIG. 3. In this manner, the side edge of container D is gripped securely between bar 38 and lever arms 40. An elongated lever arm 44 extends beyond inner lever arms 40 and includes a transverse bar member 44a which retains the wafers in a container D when gripped by the gripping device. A bracket 46 is carried by the shaft 34 by means of which an air cylinder 48 is carried which actuates the pivotable lever arms 40 and 37. The air cylinder 48 is received in the catch portion 32a of connection bearing 32 when the device is holding a container and moving the container from a horizontal configuration to a vertical configuration as illustrated in FIG. 1. Piston rod 48a is threaded at its end into the block portion 36c fixed intermediate arms 36a.

The air cylinder is a single-action cylinder wherein piston rod 48a is spring biased to the left and movable upon pressurization to the right. With air cut off to cylinder 48 piston rod 48a is pulled to the left which closes the grip of arms 40 and bar 38 about the container side as will be more fully described below. This affords a fail safe feature since the gripping arms 40 and bar 38 will continue to grip container D in the event air pressure is cut off. When the gripping device is open during actuation as shown in the solid lines in FIG. 3, the gripping device may initially engage a container whereupon the gripping devices closes as shown in the dotted lines in FIG. 3 such that the bar engages the sides 50 of the container adjacently beneath a flange 50a and lever arms 40 engage over the top edge of the side 50 into the top of the container whereby the container is gripped as illustrated.

This motion is accomplished by piston rod 48a moving to the left under spring force causing bracket housing 36 to move to the left over the shaft 34 and side thereover by means of roller pins 52. As bracket 36 is pulled left, roller pin 52 engages a rear camming inclined edge portion 40b of the inner lever arms 40 to pivot the arms clockwise as roller pin 52a engages arm cam portion 37a pivoting arm 37 and bar 38 counterclockwise. Also when lever arm 40 and bar 38 are in a gripping position a rear portion 36c of bracket housing 36 engages a sensing switch 53 to indicate the grip is closed. A pressure sensitive switch 53a inside bar 38 detects that a container is gripped thereby.

Referring now to pickup station assembly Y where the containers are picked up and returned, pedestal means C is illustrated in the form of a first pedestal platform 54 and a second pedestal, elevator platform 56. Both platforms are carried by means of a carriage 58. The carriage 58 in return is supported on a frame 60 having a base portion 60a which may rest on a support surface. Frame 60 includes a top portion 60b and box frame portion 60c. Top portion 60b includes spaced runners 62 and 62a having ends which define the path of travel of carriage 58. Carriage 58 includes rollers 58a which slide on the runners in between the ends. Rollers 58a are carried on a vertical flange 58b which supports at its top a frame 58c which supports the pedestal platform 54. Adjacent the bottom of vertical flange 58b is a cantilevered base portion 58d which is adapted for slidably receiving rods 56a and 56b in slide bushings 59. An air cylinder 64 is carried by the platform 58d and includes a slidable piston rod 64a which slidably extends through the platform 58d to connect with the platform 56 for the raising and lowering thereof. A second air cylinder 66 is carried by the box frame 60c and includes a movable piston rod 66a extending through the box frame 60c and connecting with vertical flange 58b for moving both platforms 54 and 56 laterally as the platform 56 moves vertically. A guide rod 68 is received in a bushing 68a carried by the box flange portion 60c and is connected to flange 58b to guide the carriage during travel. Means for properly positioning containers 70 and 71, on the platforms is provided by platform abutments 54c and 56c which engage a complimentary container abutment in the form of legs 70a and 71a when the containers are placed over the platform abutments. To urge the abutments, such as 70a and 56c as seen in FIG. 1, into engagement the pedestal and platforms are inclined. To accomplish this, guide runner 62 is disposed slightly lower than runner 62a.

A rectangular tray 69 having a slide handle 10a includes a pair of rectangular slots in which containers 70 and 71, illustrated in FIGS. 5 and 5a, are carried by engagement of their respective flange and tray portions. Tray 69 includes a bar separating the rectangular slots having openings in an underside thereof which fit over pins 69b carried on frame 58c which locate and hold the tray on the pedestal frame 58c.

OPERATION

As illustrated, apparatus is provided for processing a plurality of containers, such as 70 and 71, carried in tray 60 and supported upon pedestal means C in the following sequence. Referring to FIG. 5 and 5a, container 70 is in the fixed pickup position P, transfer arm 10 pivots from its neutral position N to its rear position where close proximity to container 70 affords access for engagement and pickup by gripping device B. Arm 10 then pivots to the forward position presenting container 70 in a vertical position to be loaded in cassette form with silicon wafers. The loaded container 70 is then returned to fixed position P and placed upon pedestal platform 56 which is the elevator platform. Release of container 70 is effected and transfer arm 10 is returned to its neutral position by a drive motor 22. Carriage 58 then shifts to the left placing container 71 and pedestal platform 54 at the fixed position P. During this shifting, platform 56 is lowered dropping container 70 below the side of container 71. Transfer arm 10 again moves from its neutral to rear position and container 72 is in position for engagement and pickup by the gripping device for transfer to the forward position for loading. Loaded container 71 is returned to pickup position P.

After the gripping device releases container 71 at the pickup position upon platform 54, carriage 58 shifts back to the right and elevator platform 56 is raised level with platform 54. Tray 69 is then lifted off of the pedestal assembly by raising slide handle 69a whereby the containers are transported to the next processing station such as an etching solution tank.

The above operation may be advantageously automated owing to the unique construction of the apparatus herein by conventional means such as a computer programmed to respond to sensing means illustrated in the form of switches 31, 31a, 53, 53a 54a, 56a, 76, 78 and 80 described herein. In response to signals from the switches, the computer may be programmed in a conventional manner to control motor 22 and a pneumatic circuit, such as illustrated in FIG. 6, which actuates air cylinders 48, 64, and 66 which actuate gripping device B, platform 54, and carriage 58, respectively, in the above described sequence.

As illustrated schematically, FIG. 6 includes an air supply source manifold 89a which distributes air for operating the various air cylinders according to the invention. Solenoid actuated valves 90 and 92 control air to cylinders 48 and 66 where valve 92 includes double acting solenoids 92a and 92b which control double acting cylinder 66. Valve 94 is mechanically actuated and controls air to double acting cylinder 64. Valve 94 is mounted upstanding on a horizontal brace 60d of frame 60 and includes a spring loaded mechanical switch 94a. Cantilevered base platform 58d engages and switches mechanical switch 94a to valve air into cylinder 64 for lowering platform 56 as base platform 58d moves to the left and for raising platform 56 as base 58d moves to the right.

The switches described above will detect the following movements and conditions in operation. Switches 28a and 30a are directly in the power line to motor 22 and limit the movement of arm 20 by cutting off power to motor 22 in its forward and rear position, respectively. Switches 31 and 31a detect the forward and rearward operational positions of transfer arm 10 wherein transferred containers are loaded and picked up and returned, respectively, and send these low voltage signals to the computer. Switches 53 and 53a detect closing of gripping device B and presence of a container in the grip. Switches 54a and 56a detect the presence of a container on the respective platform. Switch 76 detects elevator platform 56 in its down position. Switches 78 and 80 correspond to first and second end positions of runners 62 and 62a over which carriage 58 travels and detect, respectively the presence of the left container 70 or right container 71 at the fixed pickup position.

The above sensing switches may be utilized in automatic sequencing as follows. Initially, container 70 is supported on platform 56, switch 56a and 78 signals the computer that container 70 is so located. Arm 10 is moved to its rear position by control of motor 22 by computer command. Switch 31a signals the computer that arm 10 is in its rear operational position located at fixed pickup position P. A computer signal then actuates solenoid 90 to cut off air to cylinder 48 which actuates grip B and picks up container 70. Upon signals from switches 53 and 53a indicating the container has been gripped, the computer then actuates motor 22 pivoting arm 20 to its forward position and at the forward position actuates solenoid 90 to admit air to cylinder 48 releasing container 70 for subsequent loading with wafers at station X by conventional machinery which forms no part of the invention herein. After loading, a signal is sent from the loading machine L to the computer. Grip B is then actuated by signalling solenoid 90 to cut off air to cylinder 48 and container 70 is gripped and returned to platform 56. The computer signals solenoid 90 for release of container 70 in response to signals from switches 31a and and 56a which indicate the container is back on its platform. Signals from switches 53 and 53a tell the computer that container 70 is released and arm 20 is allowed to move to its neutral position accordingly.

At the end of this sequence, the computer also signals solenoid 92a whereby valve 92 admits air to cylinder 66 moving carriage 58 to the left, base 58d strikes and actuates mechanical switch 94 controlling air to cylinder 64 thereby lowering platform 56. This movement places platform 54 and empty container 71 at pickup position P and loaded container 70 below container 71 on the platform. Switch 80 indicates that container 71 is at the pickup position, according to the position of carriage 58 on runner 62, and the computer then controls motor 22 and returns the transfer arm to its rear, pickup position. In response to arm 10 tripping switch 31a, the computer actuates solenoid 90 and grip B picks up container 71 and the sequence of transferring and returning container 70 for loading is repeated for container 71. Upon the return of loaded container 71 to platform 54 at position P, which information is input to the computer by switches 56a and 31a, release is effected. This release is detected by switches 53 and 53a whereupon the computer controls motor 22 to return to return arm 10 to its neutral position. Also, the computer signals solenoid 92b which moves piston 66a to the right returning carriage 58 to the right end position which releases mechanical switch 94a and valve 94 to simultaneously elevate platform 56 and container 70. The loaded containers 70 and 71 may then be removed by lifting tray 69 off pins 69b and pedestal means C. The entire sequence may be repeated upon the placement of another tray and empty containers on the pedestal platform C.

It is to be understood that other modes of control may be had with the apparatus constructed according to the invention to satisfy requirements of a particular application and the details of the above generally described computer control and programming will be well within the purview of one skilled in the art.

While a preferred embodiment of the invention has been described using specific terms, such description is for illustrative purposes only, and it is to be understood that changes and variations may be made without departing from the spirit or scope of the following claims.

What is claimed is:

1. Apparatus for manipulating and sequentially transferring containers between a first station at which a container is loaded with silicon wafers and a second station at which said container is initially picked up empty and subsequently returned loaded, said apparatus comprising:
   a movable arm member movable between said first and second stations;
   a gripping device carried adjacent an end of said arm for picking up and securely gripping said container in a stable manner for transportation thereof;
   said second station processing a plurality of said containers in sequence including a fixed pickup position from which said containers are picked up individually;
   pedestal means upon which said containers are placed having variable positions for supporting said containers individually for pickup and return at said pickup position;
   means for properly positioning said containers at said pickup position on said pedestal means for positive engagement by said gripping device of said arm member;
   carriage means supporting said pedestal means;
   said carriage means being movable between first and second positions to vary said position of said pedestal means and place said containers individually at said pickup position; and
   said pedestal means including an elevator platform for supporting a first individual container and lowering said container below the level of a second container when said second container is placed at said pickup position by said carriage means, means, said lowered container affording access for engagement of said second container by said gripping device of said movable arm member.

2. The apparatus of claim 1 wherein said pedestal means includes a plurality of platforms for supporting containers individually; one of said platforms comprising said elevator platform and a second of said platforms supporting and placing said second container at said pickup position when said elevator platform and first container thereon are lowered.

3. The apparatus of claim 2 wherein said means for properly positioning said containers includes abutment means having an abutment carried by said platform and biasing means urging said container against said abutment to so position said container properly thereon.

4. The apparatus of claim 3 wherein said biasing means is provided by said platform being inclined in the direction of said abutment whereby said container moves against said abutment when placed on said platform.

5. The apparatus of claim 4 wherein said abutment means includes a complimentary abutment carried by an underneath portion thereof which engages said platform abutment when said container is placed thereon.

6. The apparatus of claim 2 wherein said platforms are carried by said carriage means, said elevator and second platforms being shifted laterally thereby so that said second platform occupies said fixed pickup position following return of said first container to said elevator platform and lowering thereof.

7. The apparatus of claim 6 including frame means, guide means carried on said frame means for guiding said carriage means for horizontal movement, said carriage means including a lower cantilevered stationary base platform spaced from said second platform, said elevator pedestal platform being carried for relative vertical movement on said lower base platform.

8. The apparatus of claim 1 wherein said gripper device comprises mechanical linkage assembly means having a first lever arm having an arm portion receivable over a side edge of said container and a second lever arm having a container side engaging portion, said first and second arms being pivotable in opposing directions to grip said container therebetween.

9. The apparatus of claim 8 including an inner lever arm means extending past said first and second lever arms having a retaining portion adapted for spanning over the top of said container holding said wafers loaded therein during movement of said container.

10. The apparatus of claim 8 wherein said side engaging portion of said second lever arm includes an elongated bar carried transverse to said second arm.

11. The apparatus of claim 8 including a cantilevered shaft carried by said end of said transfer arm, a bracket assembly having spaced brackets received over said shaft for axial relative movement and roller pins spacing said brackets facilitating sliding of said bracket assembly over said shaft, said roller pins engaging said first and second lever arms to effect said pivotal movement and closure of said grip therebetween.

12. The apparatus of claim 1 including a motor for moving said transfer arm between forward and rear positions at operational positions at said first and second stations, respectively, and stop means for limiting movement of said arm at said forward and rear positions and accurately position said arm for engagement of said containers by said gripping device.

13. The apparatus of claim 12 wherein said stop means includes switch means for terminating operation of said motor at said forward and rear limit positions.

* * * * *